United States Patent
Gadgil et al.

(10) Patent No.: US 11,648,645 B2
(45) Date of Patent: May 16, 2023

(54) PAD CONDITIONER CLEANING SYSTEM

(71) Applicant: Applied Materials, Inc., Santa Clara, CA (US)

(72) Inventors: Shantanu Rajiv Gadgil, Santa Clara, CA (US); Sumit Subhash Patankar, Fremont, CA (US); Nathan Arron Davis, Gilbert, AZ (US); Michael J. Coughlin, Livermore, CA (US); Allen L. D'Ambra, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/849,576

(22) Filed: Jun. 24, 2022

(65) Prior Publication Data

US 2022/0314397 A1 Oct. 6, 2022

Related U.S. Application Data

(62) Division of application No. 16/932,628, filed on Jul. 17, 2020, now Pat. No. 11,370,083.

(60) Provisional application No. 63/045,005, filed on Jun. 26, 2020.

(51) Int. Cl.
*B24B 53/017* (2012.01)

(52) U.S. Cl.
CPC .................. *B24B 53/017* (2013.01)

(58) Field of Classification Search
CPC ... B24B 53/003; B24B 53/005; B24B 53/017; B24B 53/02; B24B 53/095; B24B 53/12; B24B 55/02; B24B 55/03; B24D 13/12
See application file for complete search history.

(56) References Cited

U.S. PATENT DOCUMENTS

| | | | |
|---|---|---|---|
| 5,231,785 A | 8/1993 | Roberts | |
| 5,738,574 A | 4/1998 | Tolles et al. | |
| 5,785,305 A | 7/1998 | Stalker | |
| 6,206,760 B1 | 3/2001 | Chang et al. | |
| 6,358,124 B1 * | 3/2002 | Koga | B24B 53/017 451/444 |
| 7,913,705 B2 * | 3/2011 | Benner | B24B 53/017 134/198 |
| 10,525,564 B2 | 1/2020 | Akazawa et al. | |
| 11,370,083 B2 | 6/2022 | Gadgil et al. | |
| 2002/0072312 A1 | 6/2002 | Park et al. | |

(Continued)

FOREIGN PATENT DOCUMENTS

| JP | H06-198235 | 7/1994 |
|---|---|---|
| JP | 2002-079461 | 3/2002 |

(Continued)

OTHER PUBLICATIONS

International Search Report and Written Opinion in International Appln. No. PCT/US2021/039244, dated Oct. 18, 2021, 9 pages.

(Continued)

*Primary Examiner* — Joel D Crandall
(74) *Attorney, Agent, or Firm* — Fish & Richardson P.C.

(57) ABSTRACT

A method of cleaning a conditioner head includes bringing two clamps of a cleaning tool inward toward a disk-shaped pad conditioner head to press a sponge against an outer surface of the disk-shaped pad conditioner head, and creating relative motion between the cleaning tool and the pad conditioner head to wipe the sponge against the pad conditioner head.

12 Claims, 7 Drawing Sheets

(56) References Cited

U.S. PATENT DOCUMENTS

| | | |
|---|---|---|
| 2005/0079811 A1 | 4/2005 | Cheng |
| 2015/0158143 A1 | 6/2015 | Lee |
| 2017/0043449 A1* | 2/2017 | Shinozaki ................. B08B 3/10 |
| 2018/0151388 A1 | 5/2018 | Tang |
| 2019/0111395 A1 | 4/2019 | Greenizen et al. |
| 2021/0402561 A1 | 12/2021 | Gadgil et al. |

FOREIGN PATENT DOCUMENTS

| | | |
|---|---|---|
| JP | 2017-059569 | 3/2017 |
| KR | 10-2002-0044737 | 6/2002 |
| KR | 10-2008-0086014 | 9/2008 |
| TW | 465762 | 11/2001 |
| TW | 201406475 | 2/2014 |

OTHER PUBLICATIONS

Office Action in Taiwanese Appln. No. 110123386, dated Mar. 3, 2022, 13 pages (with English search report).

\* cited by examiner

Note: 5A sponge is a smooth surface sponge for wet cleaning

FIG. 5B

Note: 5B sponge is a waffled surface sponge for dry cleaning, scraping

PAD CONDITIONER CLEANING SYSTEM

CROSS-REFERENCE TO RELATED APPLICATIONS

This application is a divisional of U.S. application Ser. No. 16/932,628, filed Jul. 17, 2020, which claims priority to U.S. Provisional Application Ser. No. 63/045,005, filed on Jun. 26, 2020, the disclosure of which is incorporated by reference.

TECHNICAL FIELD

The present disclosure relates to chemical mechanical polishing, and more particularly to the cleaning of a pad conditioner.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, a conductive filler layer is planarized until the top surface of a patterned layer is exposed. For other applications, such as oxide polishing, the filler layer is planarized until a predetermined thickness is left over the non-planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. A polishing liquid is typically supplied to the surface of the polishing pad.

The polishing system typically includes a conditioner system that has a conditioner head which holds a conditioner disk with an abrasive lower surface to condition the polishing pad. Conditioning of the polishing pad maintains the polishing surface in a consistent roughness to ensure uniform polishing conditions from wafer-to-wafer.

SUMMARY

In one aspect, a pad conditioner head cleaning tool has a first clamp, a second clamp, and an arm coupling. The first clamp is configured to removably engage a first portion of a sponge against an outer surface of a disk-shaped pad conditioner head at a first location. The second clamp is configured to removable engage a second portion of the sponge against the outer surface of the disk-shaped pad conditioner head at a second location. The arm couples the first clamp to the second clamp. The arm is sufficiently flexible to permit the first clamp and the second clamp to be separated to fit around the disk-shaped pad conditioner head and sufficiently tensile to bias the first clamp and the second clamp inwardly to press the sponge against an outer surface of a pad conditioner head.

Implementations may include one or more of the following features.

The first clamp and the second clamp may be arcuate. The arm may be arcuate. The center of arc of the arcuate first clamp and the second clamp may be a center of the conditioner head when the pad conditioner head cleaning tool is secured to the pad conditioner head. The first clamp may be a unitary piece and the second clamps may be a unitary piece. Each of the first clamp and the second clamp may have an upper flange and a lower flange configured to accommodate the conditioner head. A portion of the outside surface of each of the first clamp and the second clamps may be recessed. The first clamp, the second clamp, and the arm may be a unitary arcuate body with a gap between the first clamp and the second clamp. The gap is configured to receive the sponge.

The tool may include a sponge. The sponge may be a dry sponge. The sponge may be a wet sponge. The sponge may be disk-shaped.

In another aspect, a method for cleaning a pad conditioner head includes bringing two clamping arms of a cleaning tool inward toward a disk-shaped pad conditioner head to press a sponge against an outer surface of the disk-shaped pad conditioner head, and creating relative motion between the cleaning tool and the pad conditioner head to wipe the sponge against the pad conditioner head.

Implementations may optionally include, but are not limited to, one or more of the following advantages. Polishing quality may be improved, e.g., fewer scratches and defects are created by dried abrasive particles from polishing slurry buildup detaching from the pad conditioner during the polishing process. Additionally, the quantity of wafers scrapped due to defects can be reduced. Maintenance down time for the polishing system may be significantly decreased. This improves productivity of the polishing system and reduces operator time because less time is devoted to the pad conditioner cleaning process. Switching between different modes of cleaning (i.e. dry cleaning and wet cleaning) is easier. The cleaning process can be quickly modified by adjusting tool pressure engagement with the pad conditioner. Also, the cleaning process can be quickly modified by changing sponge type and/or adding a cleaning fluid.

The details of one or more implementations are set forth in the accompanying drawings and the description below. Other aspects, features, and advantages will be apparent from the description and drawings, and from the claims.

BRIEF DESCRIPTION OF THE DRAWINGS

Like reference numbers and designations in the various drawings indicate like elements.

DETAILED DESCRIPTION

During chemical mechanical polishing, a polishing liquid, e.g., an abrasive polishing slurry, is supplied to the surface of the polishing pad. The polishing system typically includes a conditioner system that has a conditioner head and a conditioner disk with an abrasive lower surface to condition the polishing pad.

As the platen and polishing pad are rotated, the polishing liquid can be centrifugally spun off the polishing pad. Although some of the polishing liquid will flow off the polishing pad and can be collected in a basin, some of the polishing liquid can splash onto the conditioner head. If this occurs, the polishing liquid can form larger particulates on the conditioner head, e.g., by coagulation or simply drying. The build-up of dried or coagulated polishing liquid on the polishing pad over time has multiple deleterious effects. For example, the larger particulates can be dislodged and return to the polishing surface, thus creating the danger of scratching and defects. A significant amount of non-productive time is required to clean the conditioner head and conditioner disk to prevent build-up of the dried polishing liquid.

A conditioner head cleaning tool that can be easily attached to the conditioner head and that does not require equipment dis-assembly can alleviate these deleterious effects.

Figure 1A:
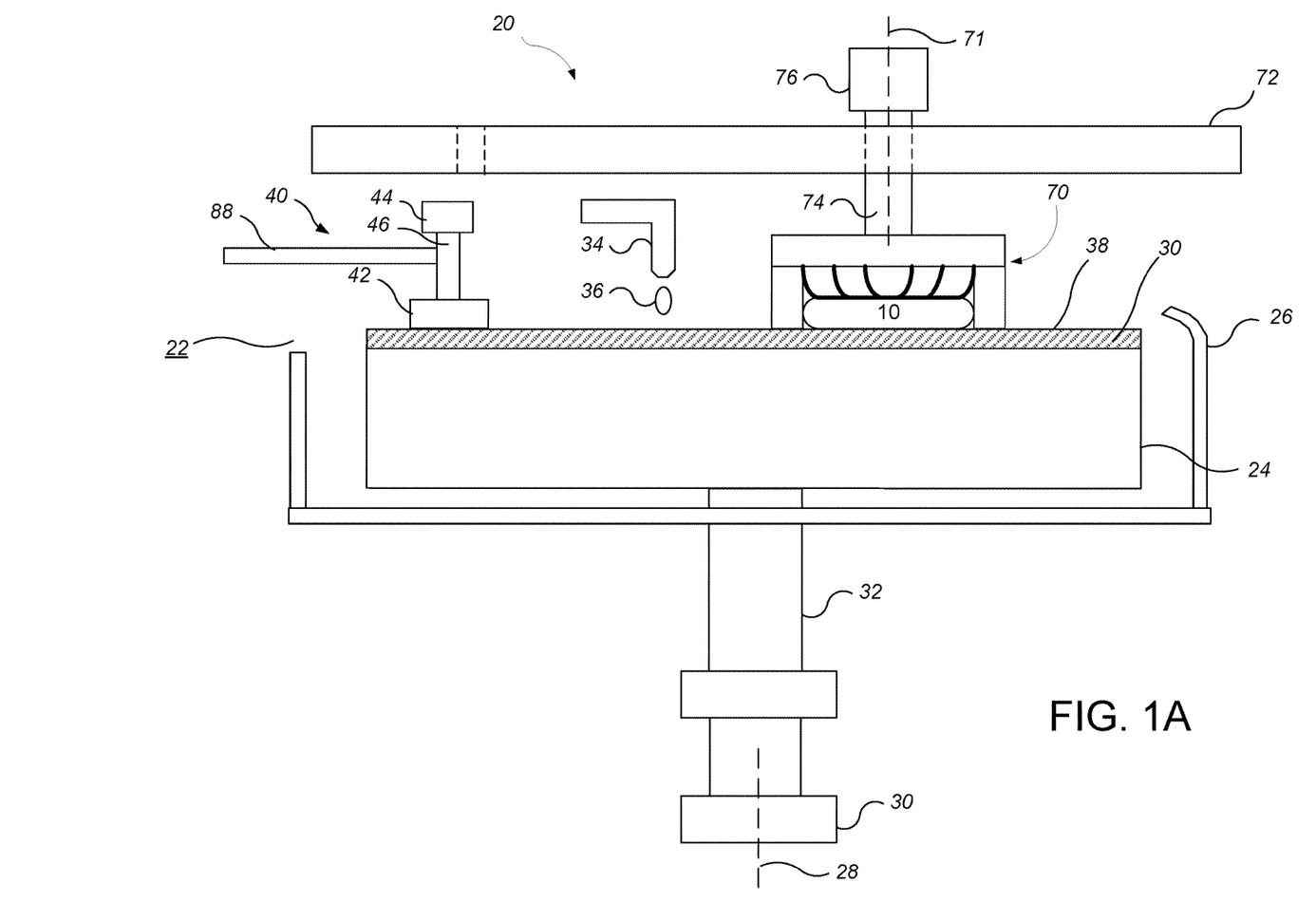
FIG. 1A shows a schematic cross-sectional view of a pad conditioner system with a conditioner head engaging a polishing pad of a chemical mechanical polishing system.

FIG. 1A shows a polishing system 20 operable to polish a substrate 10. The polishing system 20 includes a rotatable platen 24, on which a polishing pad 30 is situated. The polishing system 20 can also include a platen shield 26 surrounding the rotatable platen 24 and separated from the platen 24 by an annular gap 22. The rotatable platen 24 is operable to rotate about an axis 28. For example, a motor 30 can turn a drive shaft 32 to rotate the rotatable platen 24.

The polishing system 20 includes a carrier head 70 operable to hold the substrate 10 against the polishing pad 30. The carrier head 70 is suspended from a support structure 72, for example, a carousel or track, and is connected by a carrier drive shaft 74 to a carrier head rotation motor 76 so that the carrier head can rotate about an axis 71. In addition, the carrier head 70 can oscillate laterally across the polishing pad 30, e.g., by moving in a radial slot in the carousel 72 as driven by an actuator, by rotation of the carousel as driven by a motor, or movement back and forth along the track as driven by an actuator. In operation, the platen 24 is rotated about its central axis 25, and the carrier head 70 is rotated about its central axis 71 and translated laterally across the top surface of the polishing pad 30.

The polishing system 20 can include a polishing liquid delivery arm 34. During polishing, the arm 34 is operable to dispense a polishing liquid 36. The polishing liquid 36 can be a slurry with abrasive particles. The polishing liquid 36 can be referred to by multiple names, e.g., abrasive polishing slurry, abrasive polishing liquid, or polishing slurry.

Figure 4:
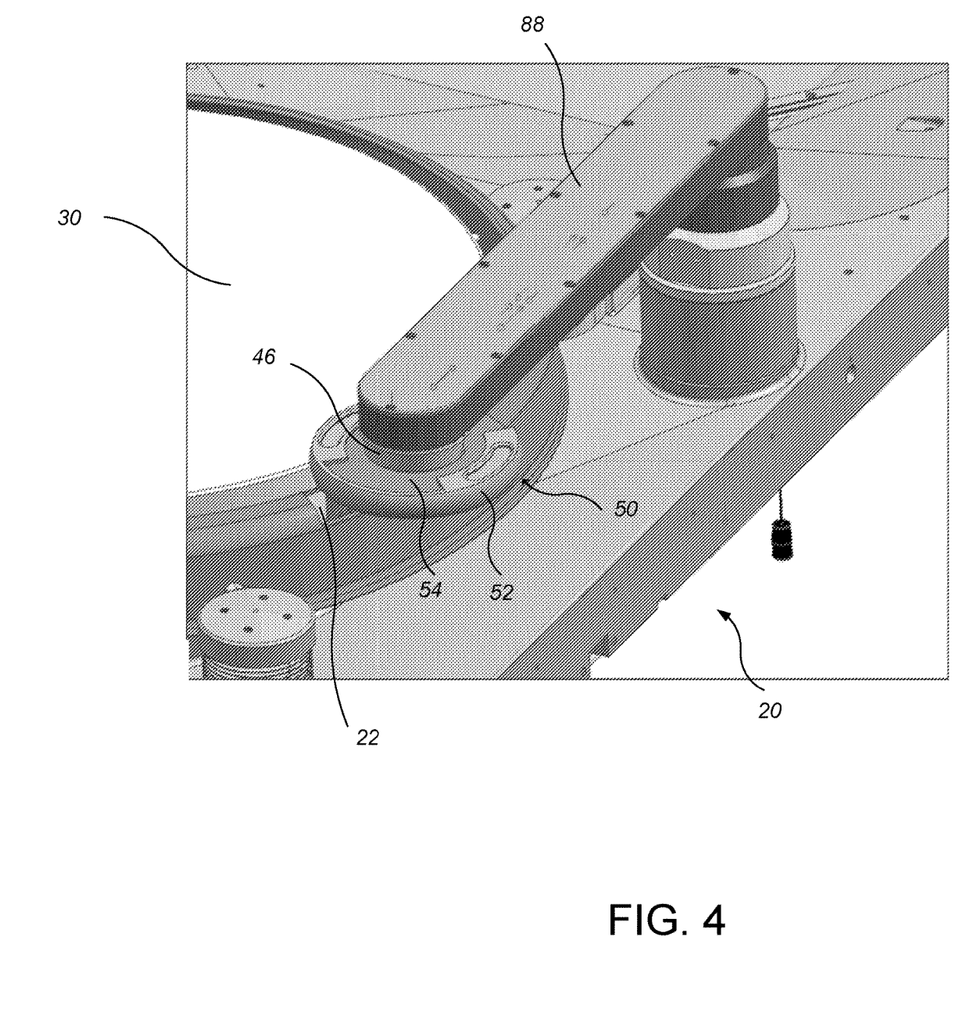
FIG. 4 shows a front perspective view of a pad conditioner cleaning system installed on the pad conditioner system with the pad conditioner system dis-engaged from the chemical mechanical polishing system of FIG. 1.

The polishing system 20 can also include a conditioner system 40 with a rotatable conditioner head 42, which can include an abrasive lower surface, e.g. on a removable conditioning disk, to condition the polishing surface 38 of the main polishing pad 30. The conditioner system 40 can also include a motor 44 to drive the conditioner head 42, and a drive shaft 46 connecting the motor 44 to the conditioner head 42. The conditioner system 40 can also include an actuator configured to sweep the conditioner head 40 laterally across the polishing pad 30. The conditioner system 40 can also include an arm 88 to rotate the pad conditioner head 42 to move laterally onto and off of the polishing pad 30. A notch or cut-out 22 can be formed in the platen shield 26 to permit the conditioner head 40 to move laterally off the polishing pad 30, as shown in FIG. 4.

Although some of the polishing liquid 36 will flow off the polishing pad 30 and can be collected below the polishing system 20, some of the polishing liquid 36 on the polishing pad 30 can stick to the conditioner head 42. In addition, conditioning of the polishing pad 30 can dislodge polishing debris from the polishing pad 30, and this debris can also stick to the conditioner head 42. In either case, the polishing liquid 36 on the carrier head 70 can dry and further accumulate on the conditioning pad head 42.

Figure 1B:
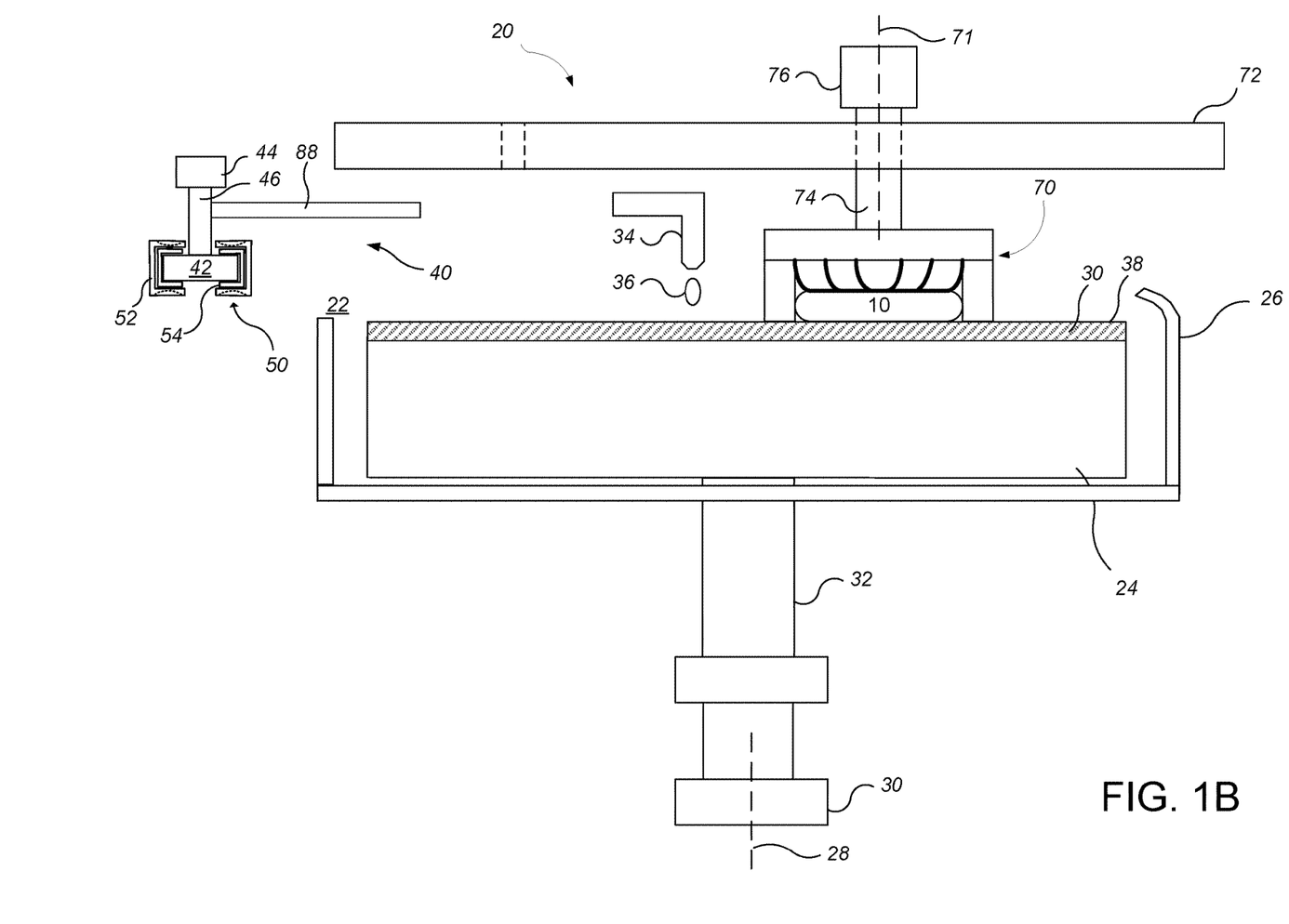
FIG. 1B shows a schematic cross-sectional view of the pad conditioner cleaning system of the chemical mechanical polishing system of FIG. 1A with the pad conditioner head at a cleaning position.
Figure 2:
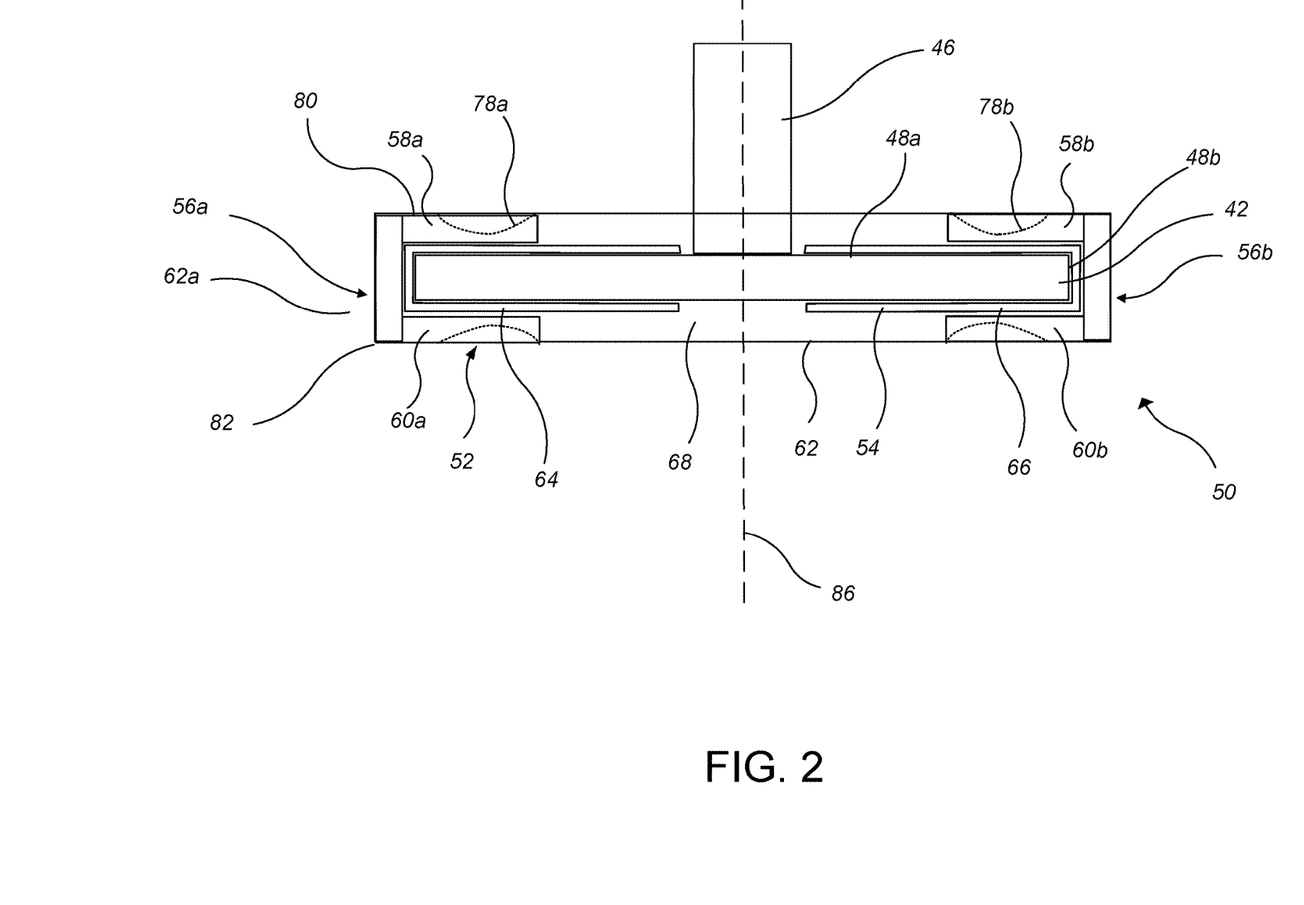
FIG. 2 shows a schematic cross-sectional view of the pad conditioner cleaning system of FIG. 1B.

FIG. 1B shows a conditioner pad head cleaning tool 50 installed on the conditioner head 42 of the polishing system 20. The conditioner pad head cleaning tool 50 includes a sponge holder 52 and a sponge 54. As shown in FIG. 2, the sponge holder 52 biases the sponge 54 against one or more surfaces of the pad conditioner head 42.e., the top surface 48a or side surface 48b, to clean the pad conditioner head 42.

Figure 5A:
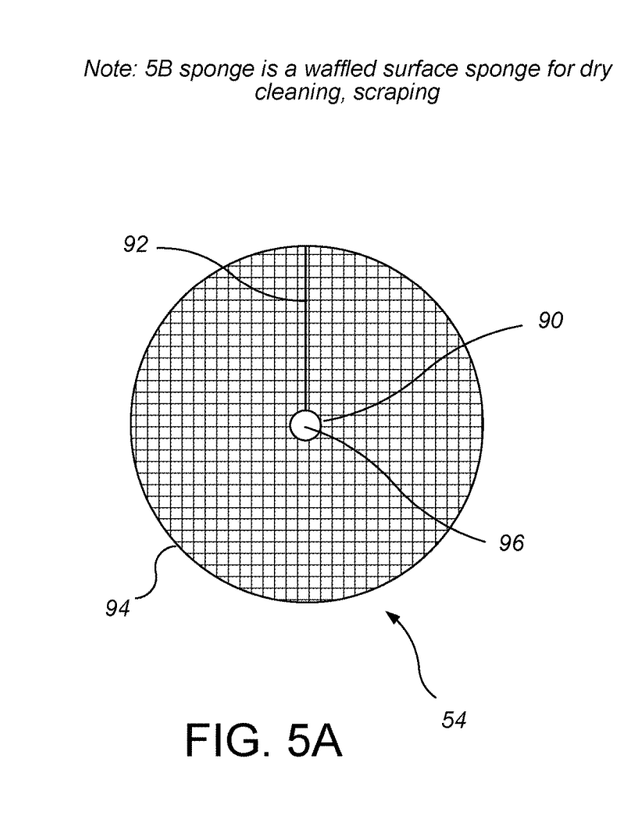
FIG. 5A shows a front view of a first sponge of FIG. 1B.
Figure 5B:
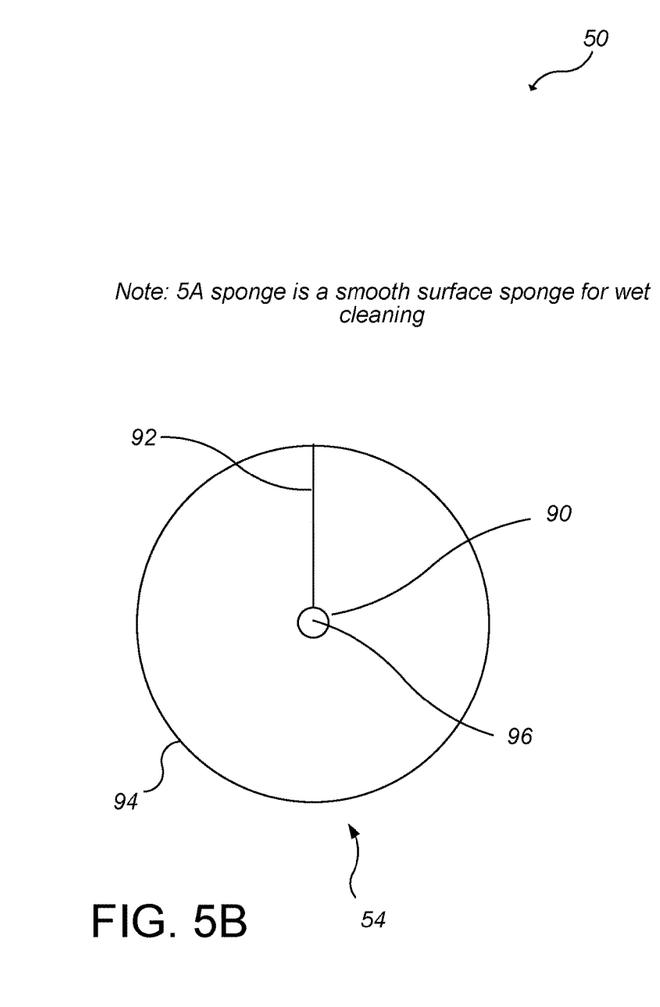
FIG. 5B shows a front view of a second sponge of FIG. 1B.

Referring to FIGS. 5A and 5B, the sponge 54 can be disk-shaped. The sponge 54 can have an aperture 90 extending through body of the sponge and positioned at the center 96 of the sponge. The aperture 90 is sized to accommodate a diameter of the drive shaft 46 connecting the motor 44 to the conditioner head 42. A slot 92 extends from the perimeter 94 of the sponge 54 to the void. The slot 92 allows the sponge 54 to be placed around the pad conditioner head 42.

The sponge 54 is made of a soft, porous, absorbent material. The sponge 54 can be made of a naturally occurring material or a synthetic material. For example, the sponge 54 can formed from naturally occurring material, such as vegetal cellulose, an animal sea sponge, hemp, or wood fiber. Alternatively, the sponge 54 can be formed from a synthetic material, such as polyester or polyurethane.

The sponge 54 can be a dry sponge or a wet sponge. A dry sponge does not have any fluid chemicals added to the sponge. The dry sponge can be used for scraping. Referring to FIG. 5A, the dry sponge can have a waffled surface texture to enhance scraping. A wet sponge has a fluid added to the sponge. A wet sponge can be used to can be used to scrape off dry polishing liquid 36 buildup, soften and loosen dry polishing liquid 36 buildup, or to apply a chemical to the pad conditioning head 42, as shown in FIG. 5B. For example, de-ionized water, isopropyl alcohol, or potassium hydroxide can be applied to the sponge.

Figure 3:
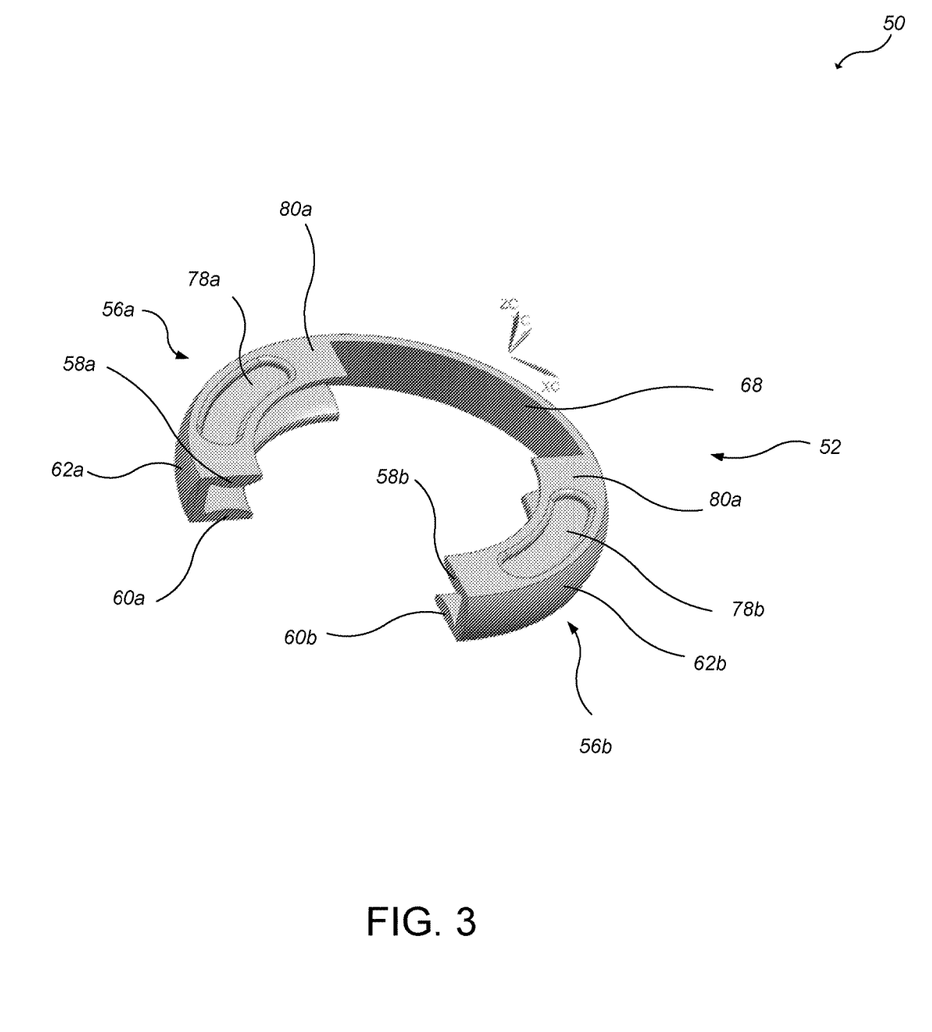
FIG. 3 shows a front perspective view of the pad conditioner cleaning system of FIG. 1B.

Referring to FIGS. 2-4, the sponge holder 52 includes two clamps 56a and 56b. Each clamp 56 has an upper jaw 58 and a lower jaw 60. A frame 62 connects the upper jaw 58 and the lower jaw 60. The first clamp 56a has an upper jaw 58a and lower jaw 60a connected by frame 62a configured to engage a first portion 64 of the sponge 54 against the conditioner head 42. The second clamp 56b has an upper jaw 58b and a lower jaw 60b connected by frame 62b configured to engage a second portion 66 of the sponge 54 against the conditioner head 42. The upper jaw 56 and the lower jaw 58 can articulate, e.g., be splayed apart, to attach to the conditioner head 42.

The two clamps 56a and 56b are arcuate, i.e., from a top view. Outer surfaces of the upper jaw 58 and the lower jaw 60 can have a recess 78 form in the top surface 80. The first clamp 56a has a top surface 80 with a recess 78a. The second clamp 56b has a top surface 80 with a recess 78b. The recesses 78a and 78b are configured to enhance the hold of an operator on the clamps 56a and 56b. A bottom surface 82 of the clamps 56a, 56b can also have recesses 78.

Inner surfaces of the upper jaw 58 and the lower jaw 60 can be flat, e.g., as shown in FIG. 2, or convex, e.g., as shown in FIG. 3.

The clamps 56a and 56b are connected by an arm coupling 68, shown in FIG. 3. The coupling arm can be arcuate boy. The arm coupling 68 is sufficiently flexible to permit the first clamp 56a and the second clamp 56b to splay the clamps 56a and 56b apart to fit around the pad conditioner head 42 and sufficiently tensile to bias the first clamp 56a and the second clamp 56b inwardly to engage the outer surface 48 of a pad conditioner head 42. If the sponge extends along the outer surface 48, then the first clamp 56a and the second clamp 56b can press the sponge 54 inwardly against the outer surface 48 of the conditioner head 48. The first clamp 56 and the second clamp 56b are arranged by the arm coupling 68 so that a center of arc of the first clamp and the second clamp is a center of the conditioner head 42 when the pad conditioner head cleaning tool 50 is secured to the pad conditioner head 42. The first clamp 56b, the second clamp 56b, and the arm coupling 68 can be a unitary piece. Each clamp has an upper flange and a lower flange configured to accommodate the conditioner head.

The sponge 54 is held by the sponge holder 52 such that an outer surface 84 of the sponge 54 is pressed against at least one surface 48 of the pad conditioner head 42. In operation, the sponge holder 52 and the sponge 54 can be rotated about an axis 86, e.g., by an operator, while the pad conditioner head 42 remains stationary. In some implementations, the sponge holder 52 and sponge 54 are rotated alternately in clockwise and counter-clockwise directions. Alternatively, the pad conditioner head 42 can be rotated about the axis 86, e.g., by rotation of the drive shaft, while the operator holds the sponge holder 52 and sponge 54 stationary. In either case, the sponge holder 52 holds the sponge 54 in contact with the pad conditioner head 42, and the relative motion wipes or scrapes off buildup of the polishing liquid 36.

The sponge holder can made of resilient plastic. For example, the sponge holder can be steel, aluminum, high density polyethylene, or a composite.

Figure 6:
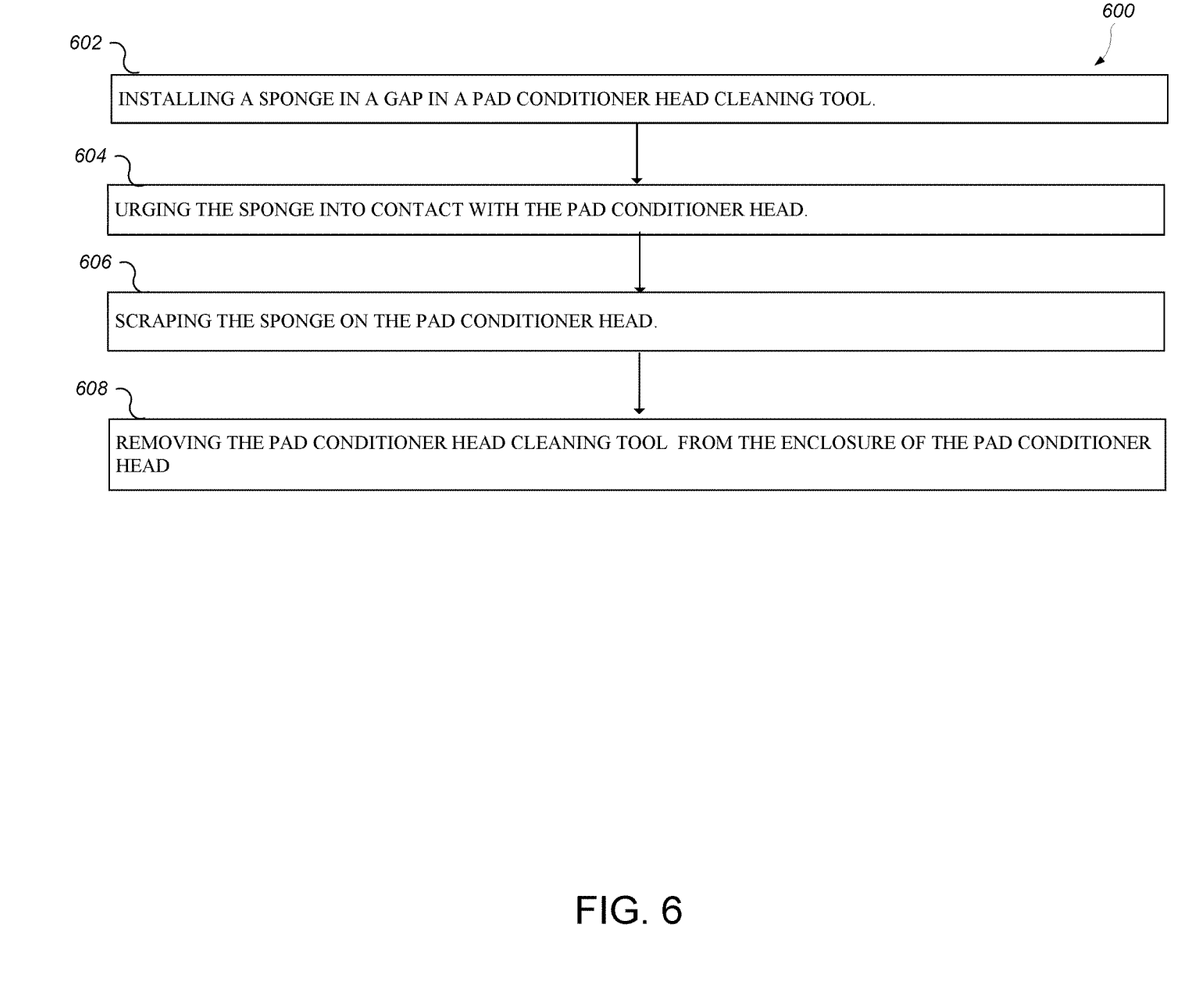
FIG. 6 shows a method of cleaning a pad conditioner.

FIG. 6 shows a method 600 of cleaning a pad conditioning head with a pad conditioner head cleaning tool. At 602, a sponge is installed in a gap in a pad conditioner head cleaning tool. Alternatively, the sponge can be placed directly on the pad conditioner head. At 604, the cleaning tool is installed on the conditioner head. Installing the pad conditioner head cleaning tool can include splaying apart a first clamp and a second clamp, moving the cleaning tool to surround the conditioner head (and the sponge), and releasing the first clamp to hold the sponge against the conditioner head. The sponge can be further urged into contact with the pad conditioner head, e.g., by pressure applied by the operator to outside of the clamps. At 606, the sponge scrapes the pad conditioner head. The sponge is in contact with the pad conditioner head. Scraping the pad conditioner head can include rotating the pad conditioner head and/or rotating the pad conditioner head tool. In some implementations, the scraping includes alternating directions with a clockwise-anticlockwise motion. The pad conditioner head can be scraped with a dry sponge. A wet sponge can be moistened with a cleaning solution. The pad conditioner head can then be scraped with a wet sponge. At 608, the pad conditioner head cleaning tool is removed from the pad conditioner head.

A number of embodiments have been described. Nevertheless, it will be understood that various modifications may be made. Accordingly, other embodiments are within the scope of the following claims.

What is claimed is:

1. A method of cleaning a conditioner head, comprising:
   bringing two clamps of a cleaning tool inward toward a disk-shaped pad conditioner head to press a sponge against an outer surface of the disk-shaped pad conditioner head; and
   creating relative motion between the cleaning tool and the pad conditioner head to wipe the sponge against the pad conditioner head.

2. The method of claim 1, wherein creating relative motion comprises rotating the pad conditioner head.

3. The method of claim 2, wherein the sponge is wiped against the pad conditioner head while the pad conditioner head is attached to a drive shaft of a conditioner system of a chemical mechanical polishing system.

4. The method of claim 3, wherein rotating the pad conditioner head comprises a controller causing a motor to rotate the drive shaft.

5. The method of claim 2, wherein creating relative motion comprises rotating the pad conditioner head tool in alternating directions with a clockwise-anticlockwise motion.

6. The method of claim 1, wherein the sponge is a dry sponge.

7. The method of claim 1, further comprising:
   moistening the sponge with a cleaning solution to provide a wet sponge; and
   wiping the pad conditioner head with the wet sponge.

8. The method of claim 1, wherein the two clamps are arcuate.

9. The method of claim 1, wherein the two clamps of the cleaning tool are connected by a coupling arm.

10. The method of claim 9, wherein the two clamps and coupling arm are a unitary part.

11. The method of claim 9, comprising splaying the two clamps apart to fit the two clamps around the disk-shaped pad conditioner head.

12. The method of claim 1, wherein each of the two clamps includes an upper jaw and a lower jaw separated by a gap, and comprising inserting the sponge into the gap between the upper jaw and the lower jaw.

* * * * *